US012696425B2

(12) United States Patent
Reinhold et al.

(10) Patent No.: US 12,696,425 B2
(45) Date of Patent: Jul. 28, 2026

(54) ELECTRONIC CONTROLLER UNIT

(71) Applicant: APTIV TECHNOLOGIES LIMITED, St. Michael (BB)

(72) Inventors: Peter Reinhold, Gummersbach (DE); Falk Rademacher, Gummersbach (DE); Jochen Suck, Wiehl (DE); Benjamin Zass, Wuppertal (DE)

(73) Assignee: Aptiv Technologies AG, Schaffhausen (CH)

( * ) Notice: Subject to any disclaimer, the term of this patent is extended or adjusted under 35 U.S.C. 154(b) by 222 days.

(21) Appl. No.: 18/209,786

(22) Filed: Jun. 14, 2023

(65) Prior Publication Data

US 2023/0413486 A1      Dec. 21, 2023

(30) Foreign Application Priority Data

Jun. 15, 2022    (GB) ..................................... 2208787
May 29, 2023    (EP) ..................................... 23175897

(51) Int. Cl.
  H05K 7/20        (2006.01)
  H05K 1/02        (2006.01)
  H05K 1/14        (2006.01)

(52) U.S. Cl.
  CPC ......... H05K 7/2039 (2013.01); H05K 1/0272 (2013.01); H05K 1/144 (2013.01);
  (Continued)

(58) Field of Classification Search
  CPC ............. H05K 7/20272; H05K 7/2039; H05K 1/0272; H05K 1/144; H05K 1/145; H05K 2201/064
  (Continued)

(56) References Cited

U.S. PATENT DOCUMENTS 5,343,359  A        8/1994  Morton et al.
2009/0147482  A1*  6/2009  Katsuro ............. H05K 7/20854
                                                               361/720
(Continued)

FOREIGN PATENT DOCUMENTS

CN        105101747 A      11/2015
DE          10316449 A1    10/2004
(Continued)

OTHER PUBLICATIONS

Combined Search and Examination Report issued by the GB Intellectual Property Office in connection with International Application No. GB2208787.8, dated Nov. 7, 2022.
(Continued)

*Primary Examiner* — Zhengfu J Feng
(74) *Attorney, Agent, or Firm* — Miller Johnson

(57) ABSTRACT

The specification provides arrangements including an electronic controller unit, ECU, comprising a heatsink, a first printed circuit board, PCB; and a second printed circuit board, PCB. A plurality of components are provided located on said PCBs. The heatsink is arranged between the first and second PCBs and is thermally coupled to the components to provide cooling. The heatsink further comprises an aperture extending through a body of the heatsink. The first PCB is directly connected to the second PCB by a board-to-board, B2B, connector configured to electrically and/or communicatively connect the PCBs located above and below the heatsink. The specification also provides arrangements of a heatsink provided for use within an ECU.

18 Claims, 7 Drawing Sheets

(52) U.S. Cl.
CPC ......... *H05K 1/145* (2013.01); *H05K 7/20272* (2013.01); *H05K 2201/064* (2013.01)

(58) Field of Classification Search
USPC ........................................................ 361/720
See application file for complete search history.

(56)                       References Cited

U.S. PATENT DOCUMENTS

| | | |
|---|---|---|
| 2011/0292615 A1 | 12/2011 | Rai |
| 2015/0342023 A1 | 11/2015 | Refai-Ahmed |
| 2020/0045850 A1 * | 2/2020 | Bala ................... H05K 7/20436 |
| 2022/0293487 A1 * | 9/2022 | Teranishi ........... H05K 7/20163 |
| 2024/0268060 A1 * | 8/2024 | Teranishi ........... H05K 7/20154 |

FOREIGN PATENT DOCUMENTS

| | | | |
|---|---|---|---|
| EP | 0844808 A2 | 5/1998 | |
| EP | 3843512 A1 | 6/2021 | |
| WO | 2021018885 A1 | 2/2021 | |
| WO | WO-2022058006 A1 * | 3/2022 | .............. H05K 7/20 |
| WO | 2022192031 A1 | 9/2022 | |

OTHER PUBLICATIONS

Extended European Search Report for EP23175897.0 dated Nov. 8, 2023, 13 pages.
First Office Action in Chinese App. No. No. 202310689403.0, dated Mar. 27, 2026.

* cited by examiner

SECTION E-E

ELECTRONIC CONTROLLER UNIT

CROSS-REFERENCE TO RELATED APPLICATION

This application claims priority to United Kingdom patent application number GB 2208787.8 filed on Jun. 15, 2022 and European patent application number EP 23175897.0 filed on May 29, 2023, the entire contents of which are hereby incorporated by reference herein.

FIELD

The present application relates in general to an electronic controller unit (ECU) comprising a heatsink and a printed circuit board and related components.

BACKGROUND

An integrated electronic controller unit, ECU, may typically include a variety of processing units such as a microcontroller, system on chips, SoC, or system in packages, SiPs. These processing units themselves can be arranged at several functional printed circuit boards (PCBs). Due to requirements for up-integration of functionality that may be required for an ECU, the resulting high density of processing power and thus increasing dimension of PCBs requires new approaches of mechanical integration. Therefore, there is a need to provide an improved ECU arrangement that is adjustable and extensible to take account of the increasing variety, size requirements, and complexity of ECU configurations, specifically the mechanical integration of the elements of the ECU.

SUMMARY

The specification provides improved arrangements of an electronic control unit, ECU, configured to address problems with previous arrangements. Advantageously, the ECU according to the specification provides a flexible and expandible ECU. The ECU is also configured to provide improved cooling.

According to a first aspect there is provided an electronic controller unit, ECU, comprising

- a heatsink comprising a cooling unit having a first upper and second lower cooling plate and a fluid channel arranged between the cooling plates and configured to receive a cooling fluid, wherein the cooling fluid is circulated through the channel in proximity to said cooling plates;
- a first printed circuit board, PCB;
- a second printed circuit board, PCB, and
- a plurality of components located on said PCBs;
- wherein the heatsink is arranged between the first and second PCBs, and configured for thermally coupling to components located on said PCBs, and is configured to provide a thermal coupling of components to a respective cooling plate to effect cooling of components, as required;
- wherein the first PCB is connected to the second PCB by a board-to-board, B2B, connector which is configured to electrically and/or communicatively connect the PCBs located above and below the heatsink.

Further, in one of embodiment of the first aspect, wherein the upper and lower cooling plates (540, 545) each comprise a plurality of thermally conducting pedestals (550) extending outwardly therefrom towards the PCBs (200, 300, 400)

and components (210) located thereon, wherein each pedestal (550) is configured to provide a thermal coupling of a component (201) to a respective cooling plate, for cooling.

Arrangements of the ECU according to the specification, have a heatsink located between the PCBs and components provides for a direct thermal coupling between components and the heatsink, for cooling. As the PCBs are arranged on opposing sides of the heatsink, it is possible to locate an increased number of components in proximity with the heatsink. Within the compact arrangement a PCB surface area of effectively double that of an arrangement based on a single PCB may be provided. The ECU therefore advantageously provides a high-density (of components) and compact arrangement having improved cooling and good signal integrity.

In one embodiment of the first aspect the heatsink (500) further comprises an aperture (507) extending through a body of the heatsink, the aperture defining a path for receiving the connector (250) to provide a connection having a short path length between the PCBs located above and below the upper and lower cooling plates of the heatsink, wherein the fluid channels arranged internally within the body of the heat sink between the cooling plates and about the aperture.

In one embodiment of the first aspect, the heatsink (500) further comprises an aperture (507) extending through a body of the heatsink, the aperture defining a path for receiving the connector (250) to provide a connection having a short path length between the PCBs located above and below the heatsink.

The heatsink comprises an opening or aperture defining a path to allow connection of the PCBs located at opposing side of the heatsink using a connector of reduced length. The ECU is thus configured to provide for a short path length between the first and second PCBs. The ECU further provides for a direct electrical and/or communicative connection of the PCBs located on opposing side of the heatsink.

In embodiment of the first aspect, the heatsink comprises a heatsink housing (501) defining a receiver (503) for accommodating the components located on the PCBs, and/or the PCBs.

The housing provides a core and fundamental component of the ECU that allows for the arrangement of components and PCBs in a robust and compact housing and in proximity to the heatsink for cooling. The heatsink includes features which provide a controlled location of the components of the ECU therein.

In one embodiment of the first aspect, of the cooling unit of the heatsink, the first cooling plate (540) defines an upper surface (541) of the cooling unit (502) and the second cooling plate (545) defining a lower surface (546) thereof, and a peripheral side wall (505, 506) which when coupled together with the first and second cooling plates forms a sealed cavity, and wherein the fluid channel (520) is arranged in the cavity between the cooling plates (540, 545) and configured to receive a cooling fluid from an external cooling system.

The cooling unit is compact and arranged such the cooling fluid is circulated to key locations, including to provide a focused and directed cooling at the cooling plate end of the pedestals. The cooling unit is of compact dimensions, the dimensions of the fluid area or the plates may be adjusted depending on the cooling required. The fluid channel may comprise a plurality of connected channels.

In one embodiment of the first aspect, the ECU (100) further comprises a third PCB (400), wherein the heatsink is arranged between the first PCB (200) the third PCB (400), and configured for thermally coupling to components located on the third PCB to provide cooling.

The ECU provides a scalable and expandable ECU. The arrangement may be provided with a main first PCB and one or more add-on PCBs. The second and third PCBs are both located on one side of the heatsink and the first PCB on the over side of the heatsink. The ECU is configured such that each PCB can be directly thermally coupled to the heat sink.

In one embodiment of the first aspect, each of the PCBs and the cooling unit, is located at a different level in the vertical direction (Z) within the ECU.

The ECU is arranged to provide a split-level PCB arrangement or a stacked PCB. Overall, the stacked arrangement provides for a compact ECU having a compact footprint. The heatsink provides cooling to all of the PCBs located on both sides thereof, allowing for an efficient use of a heatsink of compact footprint.

In one embodiment of the first aspect, the upper and lower cooling plates (540, 545) comprise a plurality of thermally conducting pedestals (550). The pedestals may be configured to extend outwardly from the cooling plates in the directions of the PCBs (200, 300, 400) and components (210) located thereon, Each the pedestal (550) may be configured to provide a thermal coupling of a component to a respective cooling plate, for cooling. In one arrangement, each cooling plate (540, 545) comprises a plurality of pedestals (545), wherein each pedestal is arranged to extend in a direction generally orthogonal to a surface of the cooling plate.

The heatsink comprises pedestals that extend from the upper and lower surfaces of the cooling plates of the heatsink for direct coupling to components of the PCBs to provide heat transfer for cooling. Each cooling plate may include plurality of pedestals of different height. The pedestals are thermally conducting and configured to interface between components and the cooling plates.

In embodiment of the first aspect, each pedestal (550) is of a pre-defined height (Z) and is arranged at a pre-defined location (X-Y) relative to the cooling plate, the location and height of each pedestal being selected taking account of the location of a component relative to the cooling plate and the distance between a heat transfer surface of the component and the cooling plate Pedestals of different length are provided to ensure that each PCB is maintained at a constant level within the ECU and at a fixed separation from the adjacent cooling plate. Taking account that the height of each component on a PCB maybe different from that of other components, the height of the relevant pedestal is configured to take account of the separation of a heat transfer surface of the component from the cooling plate and not the distance between the PCB and the cooling plate.

The ECU may also include a TIM a thermal interface material which may be provided in the form of TIM pads locatable between the distal end of the pedestal and a heat transfer surface of a component. The TIM is provided to increase thermal transfer and to increase the contact area between a pedestal and a component.

In embodiment of the first aspect, the heatsink further comprises supports (580) for mechanically coupling the one or more PCBs (200, 300, 400) to the heatsink (500).

The heatsink and in the arrangement of the specification the cooling plates may include supports for coupling the PCBs to the heatsink. The supports provide a mechanical coupling.

The heatsink as manufactured includes a full set of supports for coupling to first, second and third PCBs and pedestals for coupling to components located on said PCBs.

While the ECU may be provided with first and second PCBs only. The ECU and heatsink are also configured for future scaling. The ECU is accordingly configured if needed to allow addition of the third PCB.

In embodiment of the first aspect, the heatsink (500) comprises a heatsink housing (501) configured to accommodate the cooling unit (502), the components (210) located on the one or more PCBs, and/or the PCBs of the ECU. In one arrangement, the heatsink housing (501) comprising lateral end walls (505) and longitudinal side walls (505), wherein the cooling unit (502) is located within the heatsink housing (501), the upper and lower cooling plates (540, 545) being coupled to an internal peripheral surface of the housing (501) as defined by the walls (505, 506), and being located between (Z direction) an upper and a lower opening of the housing (501) as defined by upper and lower peripheral edges of the walls.

The heatsink housing advantageously provides a core and central component of the ECU according to arrangements of the specification. It effectively provides an internal housing with integrally formed means, including for example the pedestals and supports of the cooling plates for accurately locating components of the PCBs in thermal communication with the cooling unit and for accurately locating the PCBs within the ECU within a robust and compact housing.

In embodiment of the first aspect, the heatsink housing (501) comprises one or more receivers (503) configured to receive and accommodate the components located on the one or more PCBs, and/or said PCBs, wherein each receiver (503) is defined as a cavity provided between an upper or lower surface of cooling unit as defined by the upper and lower cooling plates, and the adjacent wall of the housing (501).

The heatsink housing provides receivers to accommodate components and PCBs in proximity to the cooling unit. Further as the PCBs are located including by supports the PCBs are easily and accurately located at the required separation from the cooling unit and from other components.

The arrangement of the specification provides for receivers which can adequately and accurately accommodate the components, so that they are separated if required and coupled to the cooling plate if required. This arrangement also provides for an improved cooling by maintaining the required spacings. It is the key processing components, PCBs and connectors that are located within the housing of the heatsink which further provides good security for these components.

In embodiment of the first aspect, the ECU comprises a housing (600) defined by a housing (501) of the heatsink (500) when assembled together with a base plate (700), a top plate (610), and lateral end walls (800), to define a single unitary housing of the ECU.

The housing of the heatsink provides a robust internal structure and effectively defines a locator so that other components can be accurately located relative to each other. Further the housing of the heatsink defines at least a portion of the external housing. In this way the footprint of the heatsink is maximized relative to the overall footprint of the ECU.

In embodiment of the first aspect, the top and base plates (610, 700) are configured for connection to the housing (501) of the heatsink (500) and wherein the lateral end walls (800) are connected externally to and longitudinally spaced apparated from the lateral end walls (505) of the housing (501) of the heatsink.

Additional components may be arranged externally of the heatsink housing to provide additional functionality.

In embodiment of the first aspect, the one or more PCBs are oriented in a transverse plane (X-Y) relative to the housing (501) of the heatsink and substantially parallel to each other and the upper and lower cooling plates of the cooling unit (502). In one arrangement, the second and third PCBs (200, 300) are located to the same side of the heatsink, wherein the third PCB (400) is spaced apart in a vertical direction (Z) from the second PCB (300), and wherein the third PCB is connected to the second PCB (300) by a board-to-board connector (350). In one arrangement, the second and third PCBs (300, 400) each have a footprint, as defined by a width and length thereof in lateral and longitudinal directions, that is less that than that of the first PCB (200), wherein the third PCB (300) is arranged to at least partially overlap the first PCB (200), the second PCB (300), and the heatsink (500).

The ECU by virtue of the structure and arrangement of the components, provides a split-level PCB, comprising two or more PCBs. The arrangement allows flexibility to add PCBs and components, it also allows flexibility to vary the form or areas of the PCBs that may be included in the ECU.

In embodiment of the first aspect, the ECU further comprises a connector system (220) comprising connectors or headers (221) located at first and second lateral ends (800, 800') of the ECU, for providing connections to and from the PCBs (200, 300, 400). In one arrangement the connector system (220) comprises, a first and second lower rows (222-1, 222-2) of connectors (221) located at each of the first and second lateral ends (800, 800') of the ECU, the lower rows of connectors (221) arranged to provide connections to the first PCB at each end of the PCB. In one arrangement, the connector system (220) further comprises first and second upper rows (223-1, 223-2) of connectors (321, 421) located at each of the first and second lateral ends (800, 800') of the ECU, wherein the upper row (223-1) of connectors at the first lateral end (800) of the ECU is configured to provide connections to the third PCB (400) located adjacent thereto, and wherein the upper row (223-2) of connectors at the second lateral end (800') of the ECU is configured to provide connections to the second PCB (300) located adjacent thereto.

The arrangement of the PCBs at different levels within the ECU supports on one hand reduced volume and overall footprint requirements for the integrated ECU while maintaining sufficient space for placement and handling of ECU connectors. The arrangement provides an increased area and increased access at the lateral ends of the ECU for external connectors. The ECU accordingly supports a high density of connectors. The connectors 221, 321, 421 support external connections to the PCBs. Accordingly, the ECU provides a high density connection system 220 comprising connectors and headers arranged at different levels in two rows adjacent the ends of the PCBs located near the first or second end panel.

According to a second aspect there is provided a heatsink (500) for an electronic control unit, ECU, according to arrangements of the present specification, the heatsink (500) comprising:

a cooling unit (502) comprising a first cooling plate (540) defining an upper surface (541) of the cooling unit and a second cooling plate (545) defining a lower surface (546) of the cooling unit (502), and a side wall (505, 506) which when coupled together with the first and second cooling plates forms a sealed cavity;

a fluid channel (520) arranged within the sealed cavity between an inlet opening and an outlet opening and defining a path for the circulation of a cooling fluid through the cooling unit in proximity to the two cooling plates (540, 545) to provide a cooling effect at regions of the surfaces thereof, the cooling unit configured to receive the cooling fluid a cooling system; and wherein the cooling unit (502) further comprises an aperture (507) that extends therethrough between the upper surface (541) of the first cooling plate (540) and the lower surface (546) of the second cooling plate (545), and defining a path for receiving a connector (250), the connector (250) configured to electrically and communicatively connect PCBs located above and below the heatsink.

In embodiment of the second aspect, the first and second cooling plates (540, 545) comprise a plurality of thermally conducting pedestals (550) configured to thermally couple electronic components located on said PCBs to the heatsink respective cooling plate. In one arrangement the pedestals (550) are arranged to extend in directions substantially orthogonal to the upper or lower surfaces of the cooling unit for direct coupling to a heat transfer surface of a component to provide heat transfer from the component to the cooling plate and the cooling fluid. In one arrangement the heatsink and cooling unit further comprises an input connector (510a) for coupling the channel (520) to an input line for receiving the cooling fluid from the cooling system, and an output connector (510b) for coupling the channel (520) to an output line for returning the cooling fluid to the cooling system.

In embodiment of the second aspect, the cooling plates (540, 545) further comprise coupling supports (580) extending in directions substantially orthogonal to the upper and lower surfaces of the cooling unit and for coupling one or more PCBs to the heatsink. In one arrangement, the heatsink further comprises a heatsink housing (501) comprising a peripheral wall defined by longitudinal sides walls (506) and lateral end walls (505), wherein the cooling unit (502) is located within the housing (501) and wherein the housing (501) comprises one or more receivers (503) defined as a space between the cooling unit (502) and a portion of the peripheral wall, the one or more receivers (503) configured to accommodate components (210) of the ECU located on one or more PCBs and/or one or more PCBs.

BRIEF DESCRIPTION OF THE DRAWINGS

The following drawings are provided as an example to explain further and describe various aspects of the present disclosure:

FIG. 8 focuses in particular on showing the PCBs and the connectors of the ECU.

DETAILED DESCRIPTION OF THE DRAWINGS

Figure 1:
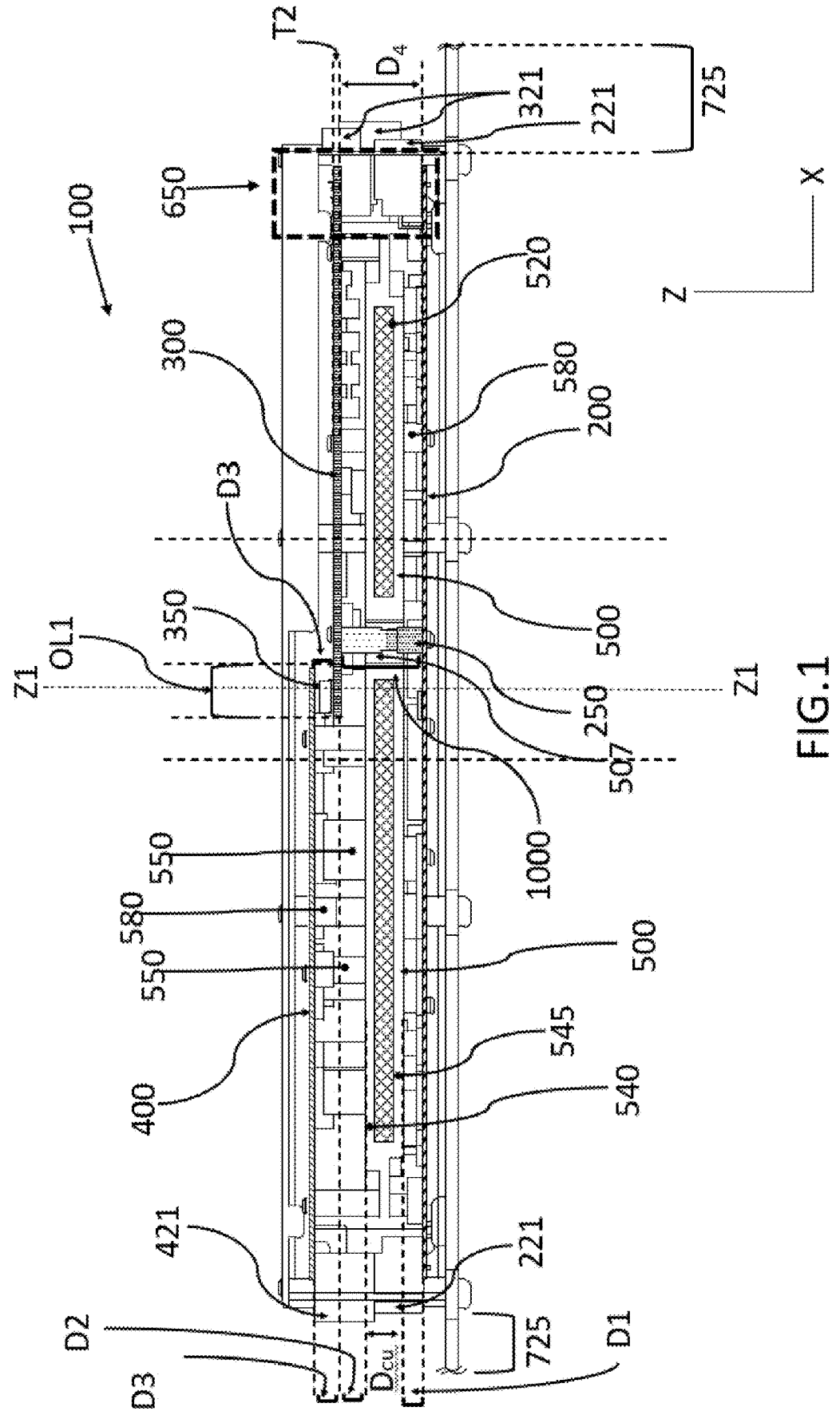
FIG. 1 is a cross-sectional view in a longitudinal side direction, of an electronic controller unit according to an arrangement of the present specification.

The following discussion provides many exemplary embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

For simplicity and clarity of illustration, reference numerals may be repeated among the Figures to indicate corresponding or analogous elements. Numerous details are set forth to provide an understanding of the examples described herein. The examples may be practised without these details. In other instances, well-known methods, procedures, and components are not described in detail to avoid obscuring the examples described. The description is not to be considered as limiting to the scope of the examples described herein.

The present specification relates to an integrated electronic control unit, ECU. The specification provides exemplary arrangements of an improved ECU. It advantageously provides an ECU that may be scaled to easily connect and extend the printed circuit board surface area. The ECU may be provided for use in a vehicle which provides functionality to various sensors and devices within the vehicle.

Referring to FIGS. 1 to 8 an electronic control unit, ECU, 100 according to an exemplary arrangement of the present application is described. FIGS. 1 to 8 show alternative views and features of the ECU 100.

The electronic controller unit, ECU, 100 of FIG. 1 comprises a heatsink 500, and first and second PCBs 200 and 300. The PCBs are configured to support components 210 mounted thereon, as required. The components 210 are provided according to required operations and applications.

The components 210 of the first printed circuit board 200 and to those of the second PCB 300, are thermally coupled to the heatsink 500 which is located between the first and second PCBs. The first PCB 200 and the second PCB 300 are directly coupled via a board-to-board, B2B, connector 250. The B2B connector provides a direct electrical coupling of the PCBs. The ECU may further comprise a third PCB 400.

While in the Figures the ECU comprises three PCBs, it is envisaged that the ECU may be provided with one (the main PCB), two or three PCBs depending on the processing requirements, required components, and particular applications. Further the configuration of the ECU provides that it may be expanded or scaled to include an additional two or three PCBs. The second and third PCBs may be provided as add-on PCBs.

The ECU 100 comprises a housing 600. The housing 600 refers to the external housing of the ECU. The housing external housing 600 is defined a housing 501 of the heatsink 500 assembled together with lateral end plates 800, 800' and upper 610 and lower housing plates 700. The housing 600 when assembled defines a self-contained unit or unitary housing.

The heatsink 500 is a fundamental and core component of the ECU 100 according to arrangements of the specification. The heatsink housing 501 forms part of the overall external housing 600 of the ECU. It also defines an internal housing comprising a cooling unit 502 of the heatsink 500 and configured to receive and locate components of the ECU including one or more PCBs and/or the components located on the PCBs, and other components such as any thermal interface material, within a robust and compact housing and in proximity to the cooling unit 502.

The heatsink housing 501 has a generally cuboid form body comprising lateral end walls 505, longitudinal sidewalls 506 which define a peripheral side wall of the housing 501. The cooling unit 502 comprises an upper cooling plate 540 and a lower cooling plate 545, a fluid channel 520 is located between the plates. The channel 520 is (FIG. 3 or 5) defines a path for the circulation of a cooling fluid through the cooling unit in proximity to the cooling plates and over the area of the heatsink. The channel 520 is arranged to loop back and forth between the lateral end walls 505 and side walls 506 of the housing 501. The portions of the channel 520 may be arranged to align with active components 210 of one or more of the PCBs. The cooling unit 502 comprises an input connector 510$a$ and an output connector 510$b$ for coupling to respective fluid lines of a fluid circuit for flow and return of cooling fluid. The cooling unit is configured to receive a cooling fluid from an externally connected cooling system at the input connector 510$a$ and to return the cooling fluid via the output connector 510$b$. The cooling fluid may be a water-based cooling fluid. However, it will be appreciated that any suitable cooling fluid may be used.

The upper and lower cooling plates 540, 545 are active in heat transfer. The lateral end walls 505, longitudinal side walls 506, cooling plates 540, 545 and channels 520 may be formed as integral and self-contained cooling unit. The cooling unit 502 defines a sealed unit within the heatsink housing 501. In use when located in an ECU 100, an upper surface 541, the external surface of the top plate 540 is oriented to face the second and third PCBs, and a lower surface 546 defined by the external surface of the base plate 545, is oriented to face the first PCB 200.

Figure 3:
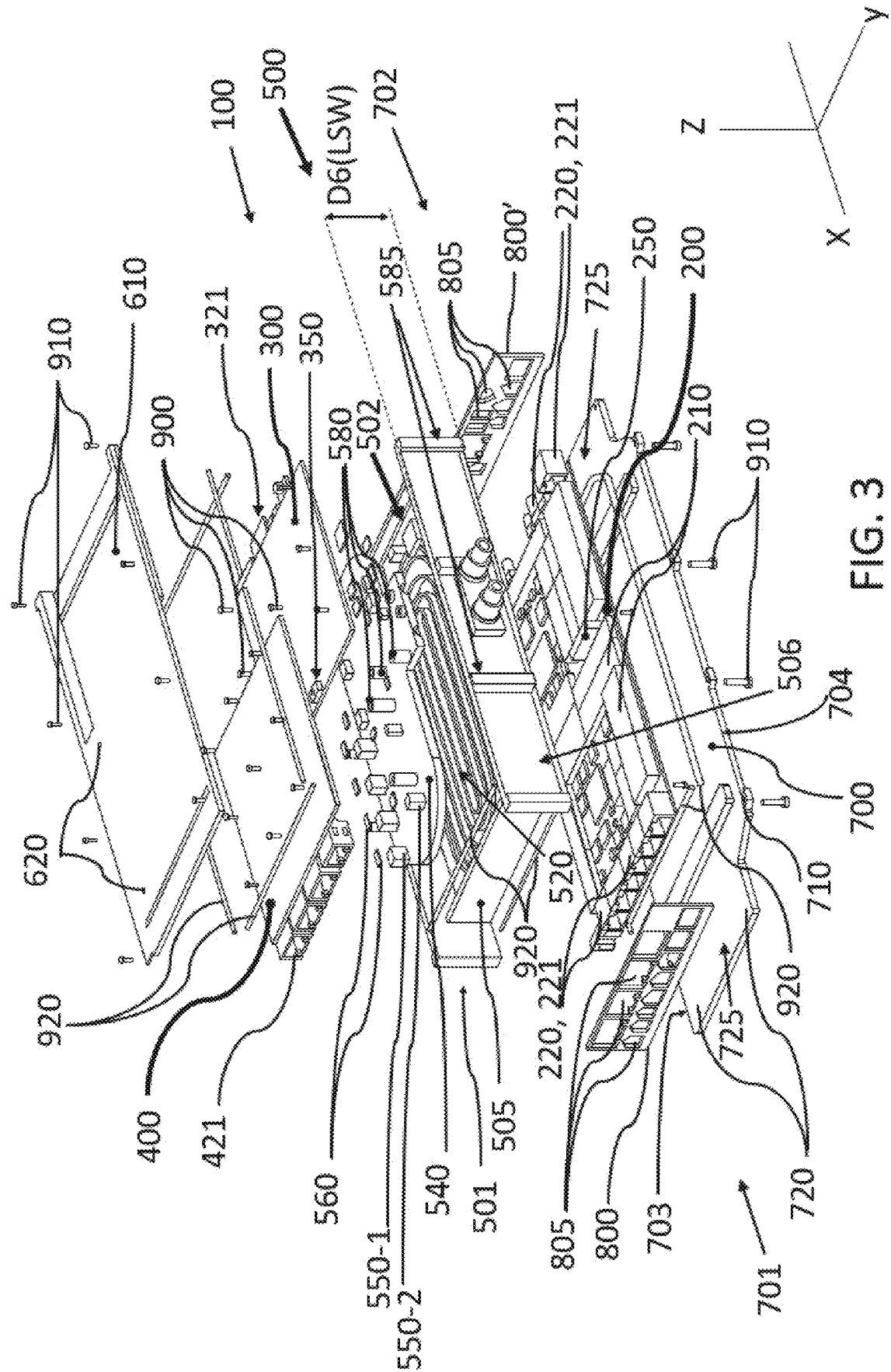
FIG. 3 is an exploded perspective view of the electronic controller unit according to arrangements of the present specification.

Referring to FIGS. 1 and 3 the cooling unit 502 is located between upper and lower edges of the peripheral side walls 505, 506 of the housing 501, at a predefined level (Z). The depth of the cooling unit Dcu (Depth cooling unit) is defined as the distance between the upper surface 541 of the upper cooling plate 540 and the lower surface 546 of the lower cooling plate 545. The depth of the housing 501 is indicated in the arrangement of FIG. 3 as the depth of the longitudinal side wall 506, Dlsw. Referring to FIG. 1 this is generally the distance from the lowermost PCB 200 to the uppermost PCB 400 (D1+Dcu+D2+D3). The depth Dcu of the cooling unit is selected taking account of cooling requirements.

The peripheral side walls 505, 506 of the housing together with the cooling unit 502 define a first upper receiver 503 and a second lower receiver 503 located above and below the cooling unit and internally of the peripheral side walls of the housing 501. The first receiver 503-1 located to the upper side of the cooling unit is configured to accommodate one or more of the components of the second and third PCBs, and the second and third PCBs in proximity to the cooling unit 502. The first receiver 503-2 located to the lower side of the cooling unit is configured to accommodate one or more of the components of the first PCB, and the first PCBs in proximity to the cooling unit 502. The volume of each receiver 503 is configured taking account of the components to be accommodated therein.

The arrangement of the housing 501 of the heatsink 500 advantageously provides a robust and compact housing as a central component of the ECU. The housing 501 and the heatsink may be pre-configured to accommodate and to locate components and PCBs as required within the ECU. The housing 501 of the heatsink defines a core structural component of the ECU.

Referring to FIG. 3, the upper and lower cooling plates 540 and 545 of the cooling unit 502 comprise pedestals 550. Pedestals 550 extend outwardly from the surfaces of the plates 540, 545 generally orthogonally thereto. Each pedestal 550-1, 550-2, 550n is located at a pre-defined location for example X1, Y1, X2, Y2 . . . Xn, Yn (X-Y directions or plane) on the plate and has a pre-defined length Z1, Z2 . . . Zn, (Z-direction) relative to the upper or lower surface of the plate.

The location and the length of each pedestal 550 is selected to provide a thermal coupling between a component located on a PCB of the ECU and the cooling unit 502. The location in X and Y is therefore generally dependent on the location of the components and the length in Z is generally dependent on the distance between a heat transfer surface of a component on the PCB and the surface of the cooling plate. The pedestals 550 are thermally conducting. As shown in exemplary FIG. 3, the pedestals 550 at located for coupling components of PCB 300 to the cooling unit are of shorter length (Z) compared to those located for coupling components of PCB 400 to the cooling unit.

The cooling plates 540 and 545 further comprise supports 580 for coupling the PCBs to the heatsink device 500 and within the ECU. The location in X and Y and the length in Z of the supports 580 can be varied as required to provide for support and or fixing of one or more PCBs to the cooling plate and heatsink. Supports 580 provided for coupling the third PCB to the upper cooling plate are of greater length (Z) than those located for coupling the second PCB to the upper cooling plate 540.

The heatsink 500 further comprises an aperture 507 effectively a channel or opening that extends through the cooling unit 502 from the upper surface 541 to the lower surface 546. The features of the cooling unit 502, including the fluid channels 520 are formed and arranged about the aperture 507. The aperture 507 defines a path for the board-to-board connector 250, to allow a direct and short pathlength connection of the first and second PCBs. The aperture 507 extends in the vertical direction (Z) and is dimensioned to accommodate the B2B connector (in X-Y and Z). As shown in the cross-sectional views of FIGS. 1 and 2 and the top view of FIG. 6, the board-to-board connector 250 extends from the first PCB 200 to the second PCB 300 and passes through the aperture 507.

The cooling unit has a generally cuboid form (X-Y-Z in the drawings)—defined by the upper plate, lower plate and longitudinal side and lateral end walls. It is essentially a sealed unit. The planar major external surfaces of the upper and lower cooling plates are arranged in use as externally facing surfaces, that face the PCBs located above and below cooling unit. The fluid channels are arranged internally within the cooling unit between the cooling plates to circulate the cooling fluid to cooling surfaces. The cooling unit accordingly presents a major surface of each cooling plate to the components to be cooled. The fluid channels are not exposed but rather located internally within the housing. These cooling plates as shown in the drawings comprise generally continuous planar plate surfaces that extend in a transverse plane across the body of the ECU housing. In the exemplary arrangement of the Heat transfer from each component to the cooling unit is via the upper and lower cooling plates. The aperture is formed between the surfaces of the cooling plate in the vertical direction and the fluid channels are arranged about the aperture. The overall housing of the ECU similarly has a cuboid form—such that the components are arranged in a stack therein—with the PCB below the cooling unit the major surface of the PCB generally parallel thereto and the second and third PCBs arranged above the cooling unit, and generally parallel thereto.

The ECU 100 according to the specification is therefore advantageously configured to accommodate a relatively short path length board-to-board connector. The B2B connector is configured to electrically and/or communicatively connect the PCBs located above and below the heatsink.

Figure 5:
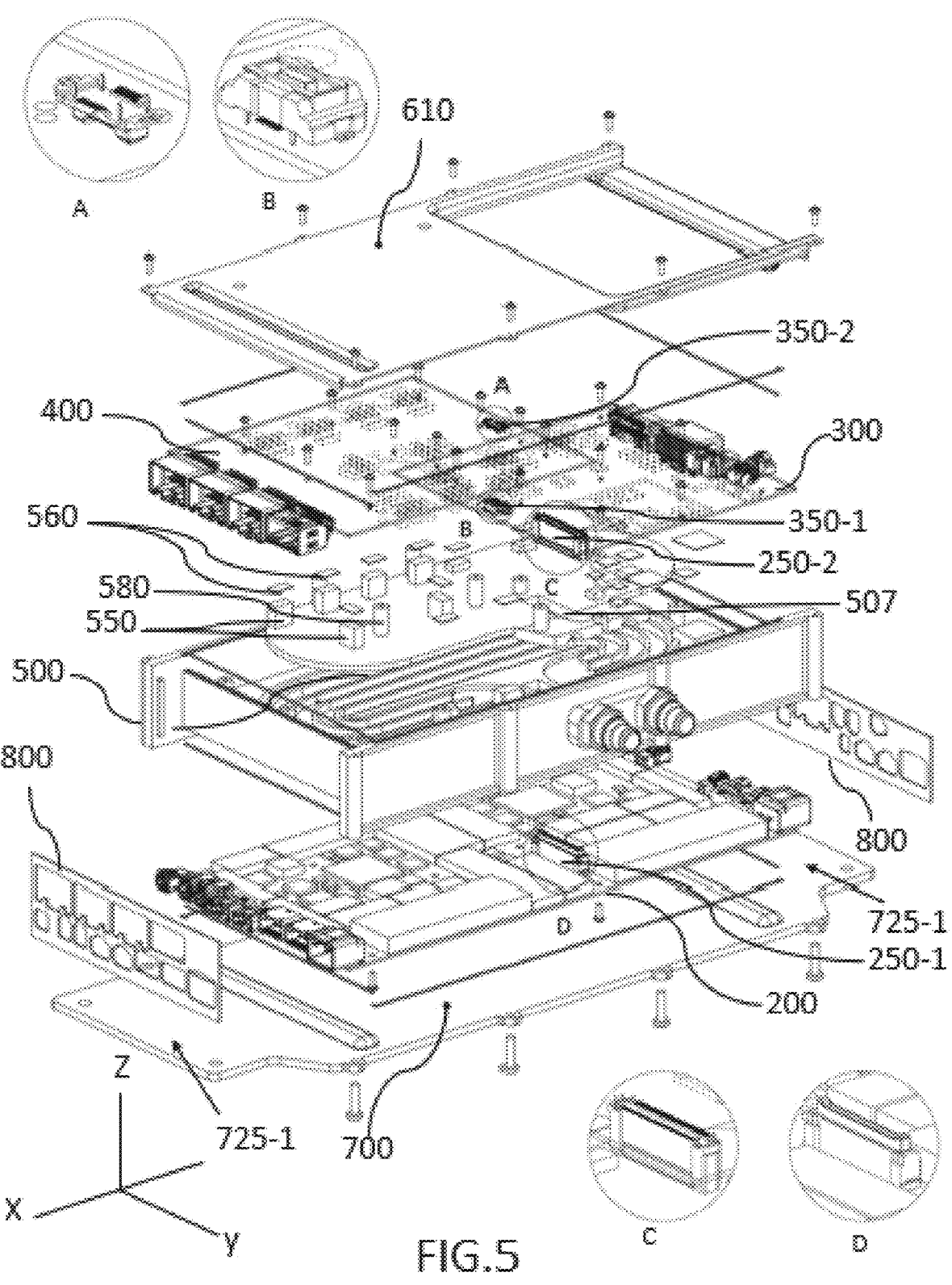
FIG. 5 shows an exploded perspective view similar to that of FIG. 3 of an ECU according to an exemplary arrangement of the specification.
Figure 6:
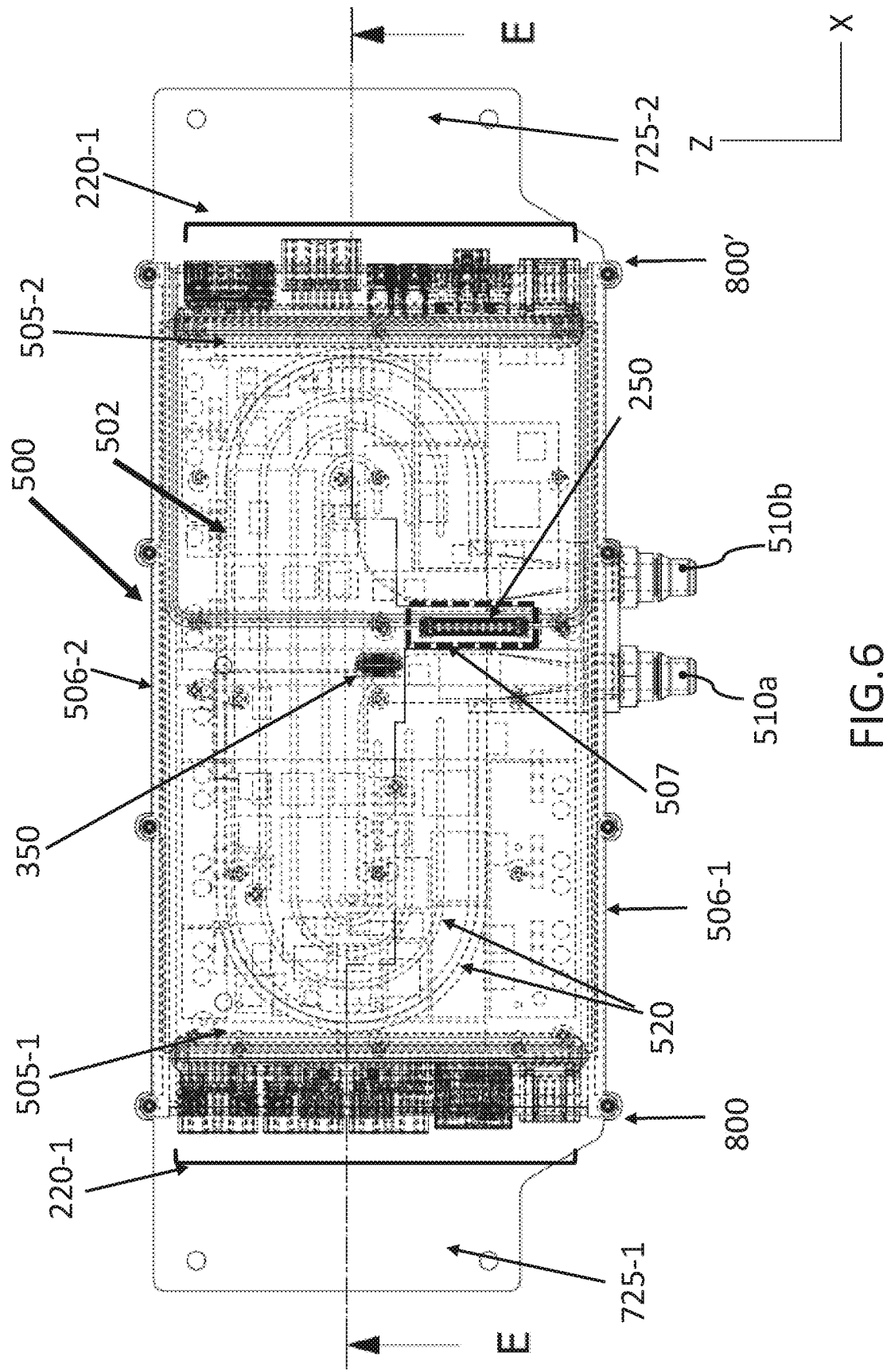
FIG. 6 shows a transparent view from above of an ECU according to an exemplary arrangement of the specification.
Figures 7, 8:
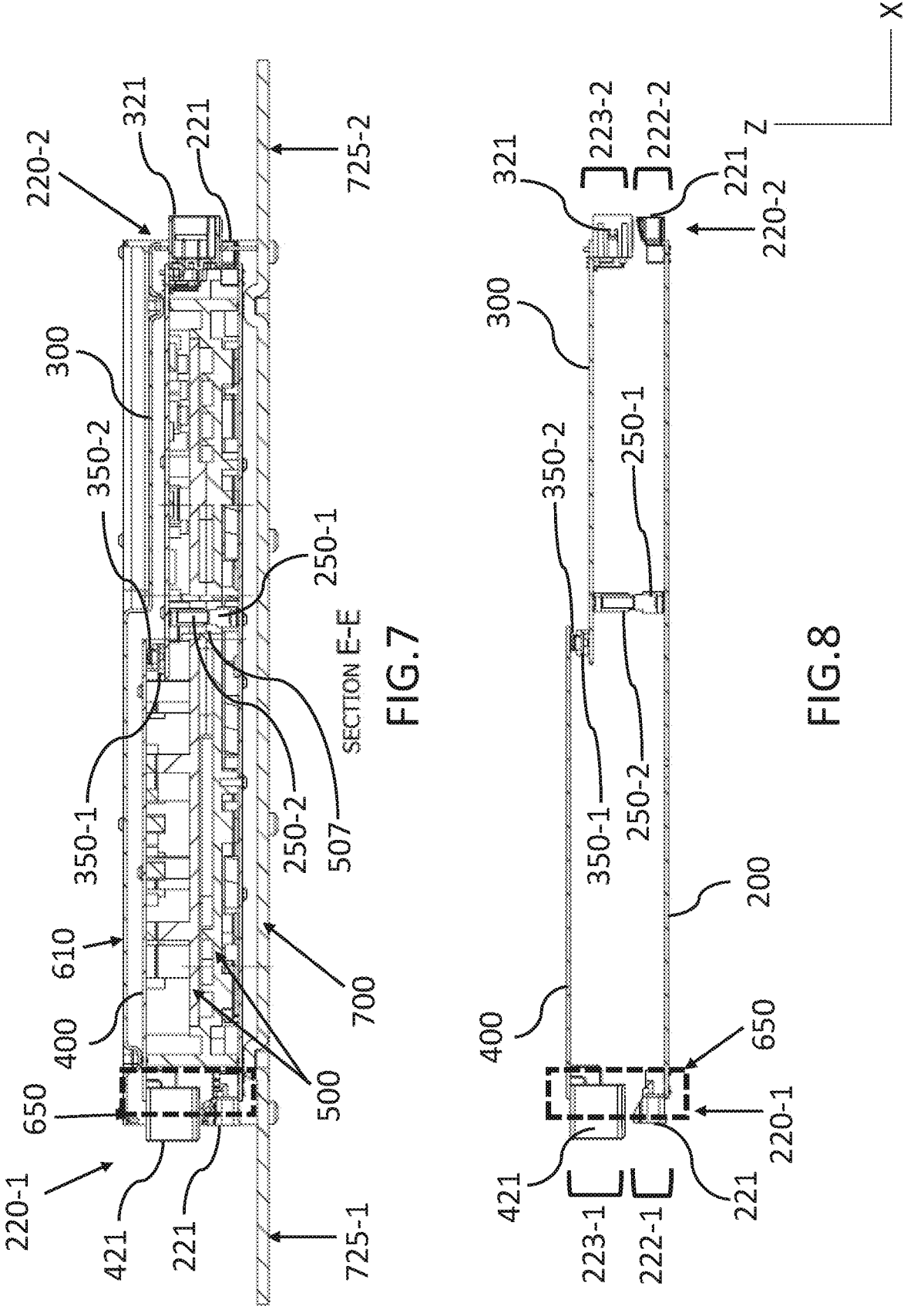
FIGS. 7 and 8 are cross-sectional view, longitudinal side views, of an electronic controller unit according to arrangements of the present specification.

As shown in FIGS. 5, 6 and 7, the connector 250 is comprised of two connecting parts 250-1 and 250-1. The ECU 100 further comprises a second connector 350 for connecting the second PCB 300 to the third PCB 400, the connector 350 is also comprised of two connecting parts 350-1 and 350-2.

The interconnecting portions of the PCBs 200, 300 and 400 as provided by the board-to-board connectors 250, 350 advantageously provides for improved packaging and handling of the ECU. The overlapping arrangement of the third PCB 400 and the second PCB 200 allows use of a standard 180-degree board-to-board connector 350.

The ECU according to the specification advantageously by the arrangement of the PCBs, heatsink and connectors provides an improved arrangement for maintaining high levels of power and signal integrity. By providing a direct connection (via one or more board-to-board connectors 250, 350 between the PCBs, the arrangement allows for maximizing cross-section values for power lines but also providing for short wiring lengths for signals having high bandwidth requirements. The arrangement takes account of the constraints of the volume of the heatsink housing 501 required for the components 210 of the ECU and the length of wiring required to maintain signal integrity at the board interconnect.

With reference to FIGS. 1, 2, 7 and 8, the PCBs 200, 300 and 400 and the cooling unit 502 are arranged at different levels in the vertical direction (Z) direction within the overall electronic control unit, ECU. Each of the PCBs 200, 300, 400 and the heatsink 500 are arranged in a transverse plane (X-Y) oriented generally parallel to that of the other PCBs and the heatsink. The ECU 100 defines a split-level ECU having a split PCB. The operable components 210 attached to the PCBs are accordingly arranged in layers within the ECU attached to the one or more PCBs.

The ECU is compact in form and the PCBs and heatsink are provided in a compact configuration that maximises the use of space within the unit. The ECU advantageously provides a high-density ECU that in the compact self-contained arrangement provided also supports a high density of components, and of headers, and connectors. As noted above, most of the components 210 and features of the ECU are accommodated within receivers 503 defined by the internal side walls 505, 506 of the housing 501 and the cooling unit. The upper and lower cooling plates 540, 545 of the cooling unit 502 comprise pedestals 550 and supports 580 for coupling of the components and PCBs within the receiver 503.

Referring to Figures and in particular FIGS. 1, 3, 5 and 6, the ECU is arranged to extend in a longitudinal direction between first and second lateral end walls 800 and 800'. The first PCB 200 and the heatsink 500 may be of similar dimensions and surface area or footprint (transverse X-Y planes). Each is arranged to extend longitudinally generally between the first lateral end 800 and the second lateral end 800' of the ECU, and laterally from the first longitudinal side 506 (front in the drawings) to a second longitudinal side 506-2 (back) of the housing 600. Therefore, the ECU comprises lateral end walls 800 located externally of the lateral end walls 505 of the housing 501 of heatsink 500 and upper and lower plates 610, 700 located externally of the housing 501, and attached thereto.

The first PCB may extend further in the longitudinal direction than the lateral side ends 505 of the heatsink 500, to provide for location of a connector system 220 of the ECU externally of the heatsink 500. The connector system 220 comprises connectors and/or headers 221 located at the lateral ends of the first PCB, and connectors and/or headers 321, 421 at the respective lateral ends of the other PCBs 300, 400 located adjacent to the lateral ends 800' and 800 of the ECU. The connectors and/or headers 221, 321, 421 do not require thermal coupling to the heatsink. The heatsink does not extend to or overlap with those end portions of the first PCB where the connectors and/or headers 221, 321, 421 are located.

The second and third PCBs 300, 400 are arranged spaced apart in the vertical direction (Z-direction), the surfaces of each being arranged in a transverse plane (in the X and Y directions). The second and third PCBs may overlap (OL1, FIG. 1) at least partially near a central portion of the ECU, relative to the longitudinal axis (X direction) between ends 800, 800' of the ECU. The central portion with reference to FIGS. 1 and 2 as that portion near a central vertical axis Z1.

The third PCB 400 is arranged to extend in the longitudinal direction (X) from the first lateral end 800 of the ECU to the central portion (around the axis Z1). The second PCB 300 is arranged to extend in the longitudinal direction from the second opposite lateral end 800' to the central portion of the ECU. Therefore, a lateral edge or end of each of the shorter PCBs 300 and 400 is located adjacent to one of the lateral ends of the ECU, and adjacent to a portion of the external connection system 220, 220-1, 220-2 of the ECU.

Referring to FIGS. 1, 7 and 8 when the heatsink housing 501 is assembled together with the top panel 610, base panel 700 and the lateral end panels 800, 800' of the ECU a cavity 650 is formed between the lateral end panels 800 and the lateral end walls 505 of the heatsink, and the PCBs. This cavity provides a space for locating the external connector system 220 including connectors and/or headers 221, 321, 421 which connected at the adjacent ends of the PCBs.

One or more connectors 221, 321 and 421 may be located at the end panels in slots 805 when the ECU is assembled together with the heatsink and the lateral end panels 800, 800'.

The board-to-board, B2B, connector 250, is used to provide the interconnection of first PCB 200 and the second PCB 300. Further if the third PCB is included a board-to-board, B2B, connector 350, is provided to interconnect the second PCB 300 and the third PCB 400. These connectors located internally within the ECU provide for electrical connection and communication between the PCBs. The connectors 221, 321 and 421 provide for external connections, electrical and communicative, to the different PCBs and components of the ECU.

The arrangement of the PCBs at different levels supports on one hand reduced volume and overall footprint requirements for the integrated ECU while maintaining sufficient space for placement and handling of ECU connectors 221, 321, 421. The arrangement provides an increased area and increased access at the lateral ends of the ECU for external connectors. The ECU accordingly supports a high density of connectors.

The location or spacing of the PCBs at different levels within the ECU 100 is supported by the heatsink 500 which comprises means for coupling of the PCBs to the heatsink and for coupling of the components 201 to the cooling unit, as described further below. The heatsink device 500 and the cooling unit 502 are arranged to provide cooling to the components attached to the PCBs 200, 300, 400 which are positioned on both sides thereof.

A thermal interface material TIM 560 may also be provided for coupling of the components 210 located on the PCBs to cooling unit 502. The pedestals 550 and the TIM 560 are thermally conducting. Pedestals 550 of different length or height are provided for use with components 210 at different separations from the cooling unit. As the third PCB 400 is arranged above the second PCB 200 (in the Z-direction) the pedestals for coupling to the third PCB are in general of greater length than those for coupling the first or second PCB to the heatsink. The heatsink 500 comprises essentially three groups of pedestals 550—those located to couple with the first PCB and those located to couple with each of the second and third PCBs if the PCBs are provided to the ECU.

In the arrangement of the Figures, the thermal interface material, TIM 560, is provided in the form of a TIM pad 560 configured for arranging between components 210 of a PCB and the pedestals 550. The TIM is provided to further improve the thermal coupling to the components and/or processing units of the PCBs to the cooling unit 502. The TIM pad 560 may be configured to surround the contact area between a pedestal 550 and the PCB component 210 to which it is thermally coupled. TIM pad 560 are accordingly arranged to provide thermal coupling of portions of the cooling unit 502 with a heat transfer surface of the components 210 located on a PCB. In this way, the pedestal 550 may be mated to the heat transfer surface of the components via the TIM pad 560. The TIM pad 560 provides a greater surface contact area between the heat transfer material and the component. The TIM pad 560 and the pedestals 550 are configured to extend between a surface of a cooling plate 540, 545 of the cooling unit 502 and the components 210 of the PCB. The use of TIM further provides improved cooling of the processing units or components of the PCBs. The TIM 560 may be any suitable material, such as phase change materials, gap fillers, thermal grease, thermal interface film and the like. It will be appreciated that which it has been described that the TIM is provided in the form of a pad, the TIM may alternatively or additionally be provided in any suitable form, such as paste, film, and the like. The TIM may be cured to create a solid material.

In one example, the ECU 100 may be provided with the first main PCB 200 and the heatsink 500 only. The ECU is configured for expansion, so that one or more PCBs 300, 400 may optionally be inserted into the ECU. The heatsink 500 as provided in the ECU 100 includes a full set of pedestals 550 and coupling members or supports 580 for coupling to the second 300 and third 400 PCBs, in addition to those provided for coupling to the first PCB 200. The ECU 100 as is therefore configured to further receive a second or second and third PCB. The heatsink 500 as manufactured comprises the pedestals 550 required to engage directly with components of the second or third PCBs or the components provided thereon, when inserted into the ECU. The heatsink as manufactured includes the supports required for mechanically coupling the second or third PCBs to the heatsink. Second and third PCBs could be retrofitted to the ECU 100.

In the arrangement of the drawings, longitudinal side walls 506 of the heat sink 500 form a part of the overall housing 600 of the ECU when assembled together with the other components and therefore in these exemplary arrangements the width of the heat sink in the lateral direction (Y) generally conforms to that of the overall ECU. Similarly, the width of the PCBs (Y direction) generally conforms to that of the ECU and the heatsink. As discussed, the PCBS may be of different extent in the longitudinal direction.

Mechanical couplings 580 or supports 580 arranged for fixing of the PCBs to the heatsink or cooling plates, and within the ECU. The spacing of the split-level PCB is supported by mechanical couplings 580. The couplings 580 allow fixing of the PCBs 300, 400 to the heatsink 500, via the top cooling plate 540, and for fixing the first PCB 200 to the heatsink 500, via the bottom cooling plate 545. The fixing means may comprise screws 900. However, it will be appreciated that other suitable fixing means may be used.

The overall length in the longitudinal direction (X-direction) required for the ECU is linked to the length of the first PCB 200 notwithstanding that a sum of the lengths of the second PCB 300 and the third PCB 400 is greater than that of the first PCB 200. In the exemplary arrangements, the features of the ECU, including the heatsink and each of the PCBs extend in the lateral direction (Y) substantially across the full width of the ECU. However, the length or longitudinal extent of the PCBs 300 and 400 may be varied depending on the required overall PCB footprint of the ECU. The option to vary the length of PCBs 300 and 400 may be available taking account of the spacing of the PCBs 300, 400 at different levels within the ECU and the potential heights (Z-direction) of components.

The arrangement of the PCBs in the ECU including the split level PCBs and at least partially overlapping arrangement of the second PCB 300 and the third PCB 400 further advantageously provides for a scalable and expandable configuration. The ECU if provided initially with a first PCB only can expanded to include 2 or 3 PCBs, in variants provided within one overall ECU arrangement. By virtue of the configuration, the option is available to fit, or not, components or whole functional add-on PCB's. The ECU 100 provides improved flexibility in manufacture for optional add-ons. The various ECUs are arranged within a single standard unitary housing.

The arrangements also provide scalability in cost optimized variants based on a single basic ECU and covered by a one-design unit that can be expanded by fitting components or whole functional add-on PCBs. Advantageously the ECU is configured for selective integration of a third PCB 400 that may be spaced apart and overlap at least a portion of a second PCB 300. In this way, in addition to providing for scaling up the functionality of the ECU by incorporating additional PCBs. The arrangement supports a scaled down cost optimized variant—for example omitting the third PCB 400.

Referring to the figures and in particular FIGS. 1, 3 and 5, the housing 600 of an exemplary arrangement of the ECU 100 is described in more detail and exemplary arrangements of the components of the housing 600 and the components located within the housing is also described in additional detail.

The housing 600 comprises a top plate 610, a base plate 700. The base plate 700 may be configured for mounting the ECU to a vehicle. Couplings or fixings 720 may be provided on the base plate 700 for affixing the ECU to a vehicle. The couplings 720 may be fastening elements provided to secure the ECU to a vehicle. The top plate 610, the base plate 700, the heatsink housing 501 and first and second lateral end panels 800 when assembled together define the overall external housing unit. The housing 600 and the heatsink housing 501 provide a receiver in which the electronic systems of the ECU can be located and/or integrated. The electronic systems being the printed circuit boards 200, 300, 400 comprising components 210 such as processing units, capacitors, resistors, inductors.

Figure 2:
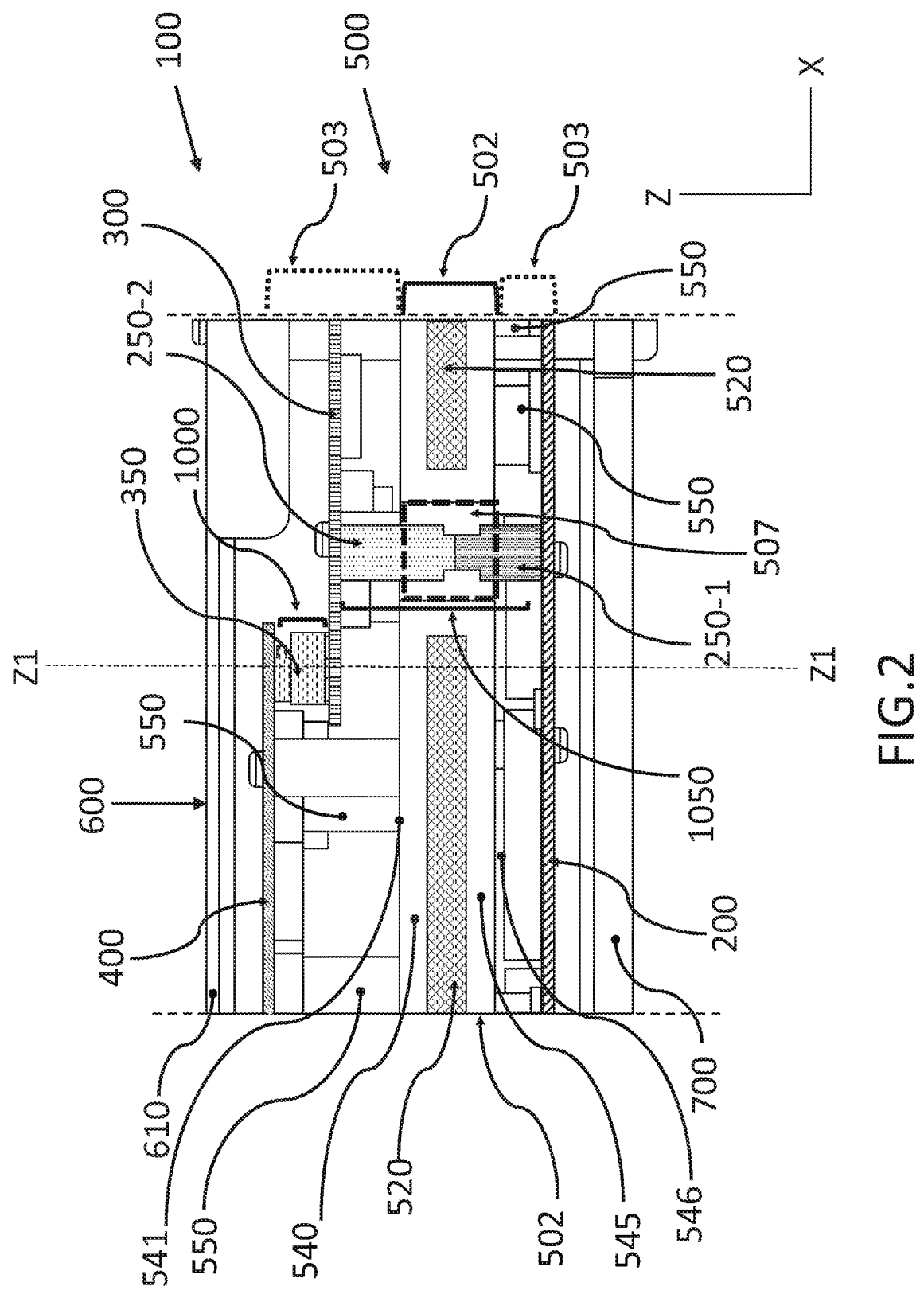
FIG. 2 is a close-up cross-sectional view of a portion of FIG. 1 showing the interconnections between the printed circuit boards according to the arrangements of the present specification.

The base plate 700 extends longitudinally (in the X direction) between first and second lateral ends 701, 702 which extend between first and second longitudinal side edges 703 and 704 of the plate. The base plate 700 is configured to be fixed to the vehicle. The fixing may be by any suitable fixing means. The base plate 700 defines the footprint of the ECU. The heatsink 500 and one or more PCBs 200, 300, 400 are arranged are different levels (in the Z-direction) within the housing 600 and heatsink housing 501. Each is arranged in a generally transverse plane and extends in the longitudinal and lateral directions (X-Y). The heatsink 500 and the first PCB 200 are of dimensions in the longitudinal and lateral directions similar to those of the housing and the top 610 and base 700 plates. Referring to FIGS. 2 and 3, portions 725 of the base plate 700 may extend outwardly in the longitudinal directions relative to the lateral end walls 800, 800' of the ECU. The extended portions 725 being configured to accommodate fixing means 720 for affixing the ECU 100 to the vehicle.

Each PCB 200, 300, 400 is configured to support various electrical components 210, as required, including for example resistors, capacitors, diodes and active components such as processing units and other components which may generate heat during operation. The processing unit may be a microcontroller, system on chip (SoC) or system in package (SiP) and the like. These active components may be prone to heating or overheating during use and operation. The components may be located on one side of the PCB or located on both sides of the PCBs. Preferably, active components such as the as system on chip, system on chip, processors, microprocessors are located on the same side of the PCB. In this way, the path length of the electrical connections and paths to and from the active components is thereby reduced.

A second PCB 300 may be integrated into the ECU 100 with the first PCB 200. The second PCB is located adjacent to, or in close proximity, to the first PCB 200 thereby reducing the electrical interconnection path between the two PCBs. The second PCB may support various components 210, as required. The components 210 may be located on one side of the PCB or located on both sides of the PCB 300. Preferably, active components such as the as system on chip, system on chip, processors, microprocessors are located on the same side of the PCB.

With reference to FIG. 1, the first PCB 200 and the second PCB, 300 are spaced apart by a distance, $D_4$. The cooling unit 502 and the components of the first PCB 200 and the second PCB 300, are located within a volume defined between the lateral end walls 800, the longitudinal side walls 506 and the distance $D_4$ in the Z direction.

The first PCB 200 and the second PCB 300 of the exemplary arrangement are oriented within the ECU such that the surfaces thereof having the active components are located facing the cooling unit 502. The cooling unit is located between the PCBs and is configured for direct coupling of the PCBs and components on the PCBs to the cooling unit 502 from both sides.

When a third PCB 400 is integrated into the ECU, the cooling unit 502 is also located between the first PCB 200 and the third PCB 400 allowing easy and quick coupling of the heatsink to the components of each of the PCBs 200, 300, 400. The first PCB 200 and the second PCB 300 are electrically and communicatively connected to one another via a connector 250. The second PCB and the third PCB are directly electrically and communicatively connected to one another via a connector 350 and the third PCB is coupled to the heatsink mechanically supports 580 and thermally to the components 210 of the third PCB by means of the pedestals 550.

To provide a path for the heat to escape, or be removed from the active components of the PCBs, the cooling unit 502 is configured to be in thermal contact with the processing units and/or various other active components 210 of the first PCB 200, second PCB 300, and third PCBs that may require cooling to maintain efficient operation. A cooling fluid passing through the cooling unit 502 of the heatsink 500 provides cooling of the active components 210 by heat transfer. One or more pedestals 550 are provided located on each of the top cooling plate 540 and the bottom cooling plate 545 of the heatsink 500. The channels 520 of the cooling unit 502 may be configured to circulate the cooling fluid in proximity to the cooling plates 540, 545 at the locations of the pedestals 550. The pedestals 550 are located to provide heat transfer from component 210 to the cooling unit and at locations in proximity to the channels 250.

The height (Z-direction) of each pedestal 550 is adapted to take account of the location and heights or vertical extent (Z-direction) of the components of the PCBs. The components of the PCBs 200, 300, 400 may be of various height with respect to the planar surface of the PCBs facing towards the heatsink 500. The pedestals 550 are configured to account of these constraints, including the locations of component in the X and Y plans and the separation of a contact surface of the components from the heat plate (Z-direction) thus providing a direct and tailored thermal coupling between the heatsink and those components when interfaced.

The top plate 610, bottom plate 700 and the heatsink 500 may be of a thermally conductive material, such as a metal or metal alloy or any suitable thermally conductive material, and further comprises couplings 585, 620, 710 for fixture to one another by suitable securing means such as but not limited to, screws 910 or any other suitable securing means. For example, top plate 610, bottom plate 700 and the heatsink 500 may be assembled together and connected to each other via respective couplings 585, 620, 710 and securing means 910 to form an enclosed housing around the ECU PCBs. The housing 600 provides a protective cover for the ECU. The first printed circuit board, PCB, 200 may be mounted on the base plate 700. Additional couplings 720 may be provided on the bottom plate 700 for affixing the ECU to a vehicle.

One or more sealing elements 920 may be provided for coupling between the peripheral edges of the PCBs 200, 300, 400, the lateral end panels 800, the heatsink 500, the top plate 600 and the bottom plate 700 when assembled. The sealing elements 920 provide a protective element for the ECU such that the sealing elements 920 ensure that there is no ingress of contaminants for example fluid into the housing of the ECU. The sealing elements 920 may be of a silicon material or any suitable material. Lateral end panels 800 may also be configured to prevent any ingress into the ECU by forming a seal around the connectors 220, 320, 420 coupled to the apertures 805 defined within the lateral end panels 800. The lateral end panels may be of a plastic material. However, it will be appreciated that any suitable material may be used.

In the illustrated arrangement of FIG. 1, the first PCB 200, the heatsink device 500, the second PCB 300 and the third PCB 400 are separated by various distances in the z-direction. As illustrated, the lower cooling plate 545 of the cooling unit 502 is spaced apart from the first PCB 200 in a vertical direction (z-axis direction), by a distance D1. The cooling unit 502 is defined by a height $D_{cu}$ (D cooling unit). The second PCB 300 is spaced apart from the upper cooling plate 540 in a vertical direction, z-axis direction, by a distance D2. The second PCB 300 is spaced apart from the first PCB 200 by a separation distance D4 which is the sum of D1, $D_{cu}$ and D2 as shown. The third PCB 400 is separated from the second PCB 300 by a separation distance D3. As shown the connector 350 connects the second and third PCBs. The third PCB 400 is spaced apart from the upper plate 540 in a vertical direction (z direction), by a distance which is the sum of the distance D2, the distance D3 plus the thickness of the second PCB T2 as shown. Each PCB 200, 300, 400 may be configured to have a particular thickness that is dependent on the PCB design. The PCBs may have one or more layers and the overall thickness T of a PCB will depend on the number of layers thereof. The separation distance 1000 may be defined as the distance or separation required between the first PCB 200 and the second PCB 300 such that signal integrity can be maintained for signal communication between the two boards 200, 300. The separation distance D4 may determine the minimum height/vertical extent $D_{cu}$ of the integrated cooling unit 502. The separation distance D4 may have an impact on the signal integrity along with the height restrictions/requirements of the components of the PCBs 200, 300. For the heatsink 500 to function efficiently and to provide the required cooling and heat transfer, it may require a minimum height for example $D_{cu}$ for the flow of the cooling liquid. The pedestals 550 are configured and arranged to take into account the height differences and provide the thermal coupling of the heatsink to the components of the PCBs 200, 300, 400. Some exemplary components 210 are shown on the PCB 200 in FIGS. 3 and 5 and referring to FIG. 5 some exemplary components located on the lower side of PCBs 300 and 400 are illustrated in outline in dash lines.

Use of the heatsink 500 and cooling unit 502 of the present specification including with reference FIG. 1, which illustrates the relative dimensions and spacing, provides an arrangement in which the separation distance, for example $D_4$, between the first PCB 200 and the second PCB 300 can be reduced whilst providing a cooling effect to components 210 of the PCBs 200, 300, 400.

In this way, the integrated heatsink 500 and cooling unit 502 of arrangements of the specification provides a means for reducing or providing the shortest wiring length for signals with high bandwidth requirements to be exchanged between the boards 200, 300, 400 when compared with some traditional means of cooling via, for example, through the use of fans. For example, taking account of the compact and high-density arrangement of the ECU it is not clear that a fan located between two boards would provide a sufficient cooling effect. In contrast the arrangement of the heatsink and the thermal coupling provided—provide an arrangement that addresses cooling required. Furthermore, the arrangements of the specification take account of the configuration to ensure sufficient volume of the heatsink to achieve sufficient cooling. The provision of pedestals further allows control of placement of the heat dissipating thermal transfer couplings to bring cooling where it is needed and avoid overheating and hot spots.

With reference to FIGS. 3, 4, 5, 7 and 8 the lateral end panels 800, 800' comprise a plurality of apertures 805 through which a plurality of connectors 221, 321, 421 extend so that the ECU can be connected to the various external systems, sensors or devices to communicatively coupling external systems, sensors or devices to the one or more PCBs.

Figure 4:
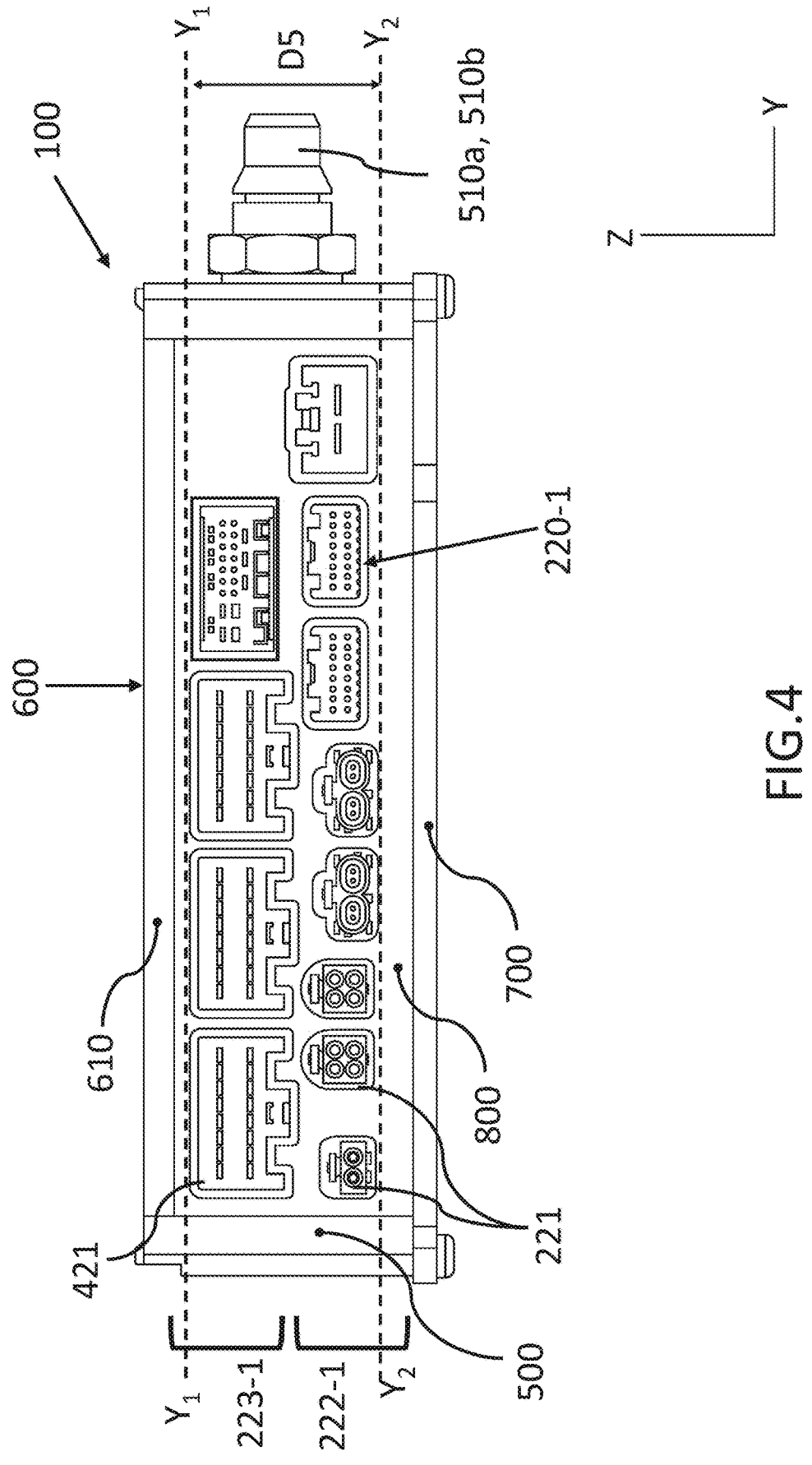
FIG. 4 is a side-view of the electronic controller unit according to an exemplary arrangement of the present specification.

With reference to FIG. 4, the arrangement of the claims and specification provides further advantages over previous ECU designs, such as single layer PCB ECU or ECUs having two PCBs. In contrast to such arrangements, the ECU having a split-level PCB arrangement according to FIGS. 1 to 4 enables sufficient space for connector placement and wiring connector handling in between both the first PCB 200 and the third PCB 400. FIG. 4 illustrates an assembled ECU housing 600 showing a portion of the heatsink 500, the top plate 610, bottom plate 700, a first lateral end panel 800, input/output connector 510a/510b of the heatsink 500 and connectors 221 of the first PCB 200 and connectors 421 of the third PCB 400. The first PCB 200 is arranged such that lateral ends thereof align with the axis defined by Y2, is located adjacent to connectors 221 which are spaced apart from one another laterally in the Y-direction along the Y2 axis—the first PCB 200 being located to the lower side of the heatsink and near the base of the ECU. The third PCB 400 is located near the upper part of the ECU near the top plate 610 and is arranged such that the lateral ends thereof align generally with the axis defined by Y1. Additional connectivity is provided through placement of connectors 421 adjacent to the third PCB and connecting thereto. The connectors 421 are located spaced apart from one another laterally in the Y-direction along $Y_1$. As shown, the connectors 221, 421 arranged at different levels (Z-direction) relative to each other. The connection system 220 (220-1 and 220-2 at the first and second ends of the ECU) comprises two rows of connectors are different levels (in the Z-direction). The two rows are shown in FIGS. 4 and 8 as an upper row 222-1 and a lower row 223-1 are provided at a first end of the ECU. It will be appreciated that a similar arrangement of connectors 321 located in an upper row 223-2 adjacent the second PCB, and connectors 221 arranged in a lower row 222-2 adjacent to the first PCB is provided at the second end of the ECU. Accordingly, the ECU 100 provides a high density connection system 220 comprising connectors and headers arranged at different levels in two rows adjacent the ends of the PCBs located near the first or second end panel.

Further, by providing the integration of the PCB 400 at an offset distance, for example distance $D_5$, to the first PCB 200, connectors of different size profiles can be used in the ECU for connection to systems external to the ECU. A total height of the ECU may therefore be limited by areas required for the connector placement only, those connectors of the integrated PCBs 200, 300 and 400, without affecting signal bandwidth requirements of the PCBs 200, 300, 400. In order to provide sufficient free space for connector placement and handling between the first PCB 200 and the third PCB 400, height level placement of or the offset distance D5 (=D1+D3 of FIG. 1) of the first PCB 200 and the third PCB may be shifted accordingly.

In view of the above, the claimed arrangements therefore provide a way to effectively split a single PCB while maintaining cooling and signal integrity. This is achieved by the split-level PCB and integration of the various PCBs into the ECU. The ECU of the specification addresses problems with previous arrangements and provides an improved ECU. The ECU 100 is configured such that the PCBs provided therein, may be located and oriented for improved cooling and improved thermal coupling to the heatsink. For example, components that require cooling (SOCs, SIPs) may be provided located on one side of PCB for direct coupling to the heatsink via the thermal pedestals 550 and TIM 560. In the split-level arrangement, the second PCB 300 and the third PCB 400 when integrated into the ECU are located at different levels in the ECU in the vertical (Z-direction). In the illustrated example of FIG. 3, the third PCB 400 is spaced apart from and located above an upper surface of the second PCB 300 by distance D3. Such arrangement of the PCBs enables sufficient space for placement and handling of ECU connectors 220, 320, 420.

The arrangement of the PCBs within the ECU advantageously provides improved power and signal integrity. The arrangement is configured to take account of maximum possible cross section values for power lines but also shortest wiring length for signals with high bandwidth requirements. The arrangement further accommodates these features. The main PCB, namely the first PCB 200, is connected to the second PCB 300 according to the reduced distance requirements based on the dimensions of the heatsink 500 and to maximise the signal integrity based on a reduced wiring length for the corresponding board-to-board interconnection via the connector 250 and based on the configuration to accommodate and locate the connector 250. In this way, signal integrity can be maintained. Furthermore, taking account of the configuration of the ECU and the split-level location of the add-on PCBs, a standard board-to-board, B2B, connector 350, can be used for the interconnection of second PCB 300 and the third PCB 400.

By effectively providing a reduced separation distance and connection length between the first PCB 200 and second PCB 300 and the second PCB 300 to the third PCB 400, the arrangement advantageously provides for good power and signal integrity. The use of board-to-board, B2B, connectors 250, 350 also provides improved ease of integration of the PCBs when assembling the ECU.

EXAMPLE 1

To further illustrate some of the advantageous features of the arrangements of the claims, exemplary dimensions of a heat sink are described.

The housing 501 of heatsink 500 of example 1 is compact and of depth (Z direction) of the order of 20-30 mm (including thermal pedestals 550). This depth is typically similar to the height of the walls 506, indicated in FIG. 3 as D6 (height of the longitudinal side wall). The thickness of the fluid area (between the upper and lower cooling plates 540, 545) may for example be in the range of 8-12 mm. The thickness or depth of the heatsink device housing 501 (in the Z direction) may be influenced by one or more of the followings parameters:

Available height of B2B Connectors with sufficient margin for signal integrity requirements Required free space on the top of the PCB's in order to place components, including passive components Manufacturing requirements for heatsink, e.g. minimum wall thickness for die cast material like AlSi9Sr, AlSi12

Fluid flow requirements like maximum allowed pressure drop

Maximum allowed total module thickness on account of general packaging restrictions

The placement of the pedestals 550 may be defined by considerations and factors including the positioning of thermal relevant components on the PCB which in turn may be based on considerations of power and signal integrity, ECAD routing, manufacturing, and thermal requirements. The hydraulic arrangement, of the arrangements provided in the present specification is configured to optimize and balance the cooling performance: that's the reason why devices like SOC's with high power density are usually located as near as possible to the fluid flow or fluid-channels. With reference to the exemplary arrangements of the drawings—the form and dimensions of the arrangement for the device of example 1—are as follows (520) Fluid channel (similar to the distance between the cooling plates): 8 mm to 12 mm; (540) Top Plate: 2.5 mm; (545) Base Plate: 2.5 mm; (550) Pedestal: 8 mm to 13 mm; (560) TIM: 0.5 mm. The example dimensions are provided—to illustrate further one exemplary arrangement according to the specification.

It will be understood that the embodiments illustrated above show applications only for the purposes of illustration. In practice, embodiments may be applied to many different configurations, the detailed embodiments being straightforward for those skilled in the art to implement.

The invention claimed is:

1. An electronic controller unit, ECU, comprising:
a heatsink including a cooling unit having a first upper and second lower cooling plate and a fluid channel arranged between the cooling plates and configured to receive a cooling fluid, wherein the cooling fluid is circulated through the channel in proximity to the cooling plates;
a first printed circuit board, PCB;
a second printed circuit board, PCB,
a third printed circuit board, PCB; and
a plurality of components located on the first, second, and third PCBs and facing respective first upper and second lower cooling plates of the cooling unit, wherein:
the heatsink is arranged between the first and second PCBs,
the heatsink is further arranged between the first PCB and the third PCB,
the heatsink is configured for thermally coupling to the plurality of components and is configured to provide a thermal coupling of the plurality of components facing toward a respective cooling plate to effect cooling of the plurality of components,
the first PCB is connected to the second PCB by a board-to-board connector that is configured to electrically and/or communicatively connect the PCBs located above and below the heatsink,
the upper and lower cooling plates each include a plurality of thermally conducting pedestals extending outwardly therefrom towards the PCBs and the plurality of components,
each pedestal is configured to provide a thermal coupling of at least one of the plurality of components to a respective cooling plate, for cooling, and
the heatsink provides a core and central component of the ECU and the ECU is arranged to provide a split-level or stacked PCB arrangement, while the heatsink provides cooling to the PCBs located on both sides thereof, allowing for an efficient use of the heatsink in a compact footprint.

2. The ECU of claim 1, wherein:
the heatsink further includes an aperture extending through a body of the heatsink,
the aperture defines a path for receiving the connector to provide a connection having a short path length between the PCBs located above and below the upper and lower cooling plates of the heatsink, and
the fluid channels are arranged internally within the body of the heatsink between the cooling plates and about the aperture.

3. The ECU of claim 1, wherein:
the first cooling plate defines an upper surface of the cooling unit and the second cooling plate defines a lower surface thereof, and a peripheral side wall which when coupled together with the first and second cooling plates forms a sealed cavity, and
the fluid channel is arranged in the cavity between the cooling plates and configured to receive a cooling fluid from an external cooling system.

4. The ECU of claim 1, wherein each of the PCBs, and the cooling unit, is located at a different level in the vertical direction (Z) within the ECU.

5. The ECU of claim 1, wherein:
each pedestal is of a pre-defined height (Z) and is arranged at a pre-defined location (X-Y) relative to the cooling plate, and
the location and height of each pedestal are selected taking account of the location of a component relative to the cooling plate and the distance between a heat transfer surface of the component and the cooling plate.

6. The ECU of claim 1, wherein the heatsink further includes supports for mechanically coupling at least one of the first, second, and third PCBs to the heatsink.

7. The ECU of claim 1, further comprising a housing defined by a housing of the heatsink when assembled together with a base plate, a top plate, and lateral end walls, to define a single unitary housing of the ECU.

8. The ECU of claim 7, wherein:
the top and base plates are configured for connection to the housing of the heatsink, and
the lateral end walls are connected externally to and longitudinally spaced apart from the lateral end walls of the housing of the heatsink.

9. The ECU of claim 1 wherein:
the second and third PCBs are located on a same side of the heatsink,
the third PCB is spaced apart in a vertical direction (Z) from the second PCB, and
the third PCB is connected to the second PCB by a second board-to-board connector.

10. The ECU of claim 1, further comprising a connector system including connectors or headers located at first and second lateral ends of the ECU, for providing connections to and from the PCBs, wherein:
the connector system includes first and second lower rows of connectors located at each of the first and second lateral ends of the ECU, and
the lower rows of connectors are arranged to provide connections to the first PCB at each end of the PCB.

11. A heatsink for an electronic control unit, ECU, the heatsink comprising:
a cooling unit including a first cooling plate defining an upper surface of the cooling unit and a second cooling plate defining a lower surface of the cooling unit, and a side wall which, when coupled together with the first and second cooling plates, forms a sealed cavity;
a fluid channel arranged within the sealed cavity between an inlet opening and an outlet opening and defining a path for the circulation of a cooling fluid through the cooling unit in proximity to the two cooling plates to provide a cooling effect at regions of the surfaces thereof, the cooling unit configured to receive the cooling fluid of a cooling system;

an input connector configured to couple the channel to an input line to receive the cooling fluid from the cooling system; and an output connector configured to couple the channel to an output line to return the cooling fluid to the cooling system, wherein:

the cooling unit further includes an aperture that extends therethrough between the upper surface of the first cooling plate and the lower surface of the second cooling plate, and defining a path for receiving a connector, the connector is configured to electrically and communicatively connect PCBs located above and below the heatsink, and the first and second cooling plates include a plurality of thermally conducting pedestals configured to thermally couple electronic components located on the PCBs and facing the respective first and second cooling plates of the cooling unit to the heatsink respective cooling plate.

12. The heatsink of claim 11, wherein the pedestals are arranged to extend in directions substantially orthogonal to the upper or lower surfaces of the cooling unit for direct coupling to a heat transfer surface of a component of the electronic components to provide heat transfer from the component to the cooling plate and the cooling fluid.

13. The heatsink of claim 11, wherein the cooling plates further include coupling supports extending in directions substantially orthogonal to the upper and lower surfaces of the cooling unit and for coupling one or more PCBs to the heatsink.

14. The ECU of claim 9 wherein:

the second and third PCBs each have a footprint, as defined by a width and length thereof in lateral and longitudinal directions, that is less than that of the first PCB, and the third PCB is arranged to at least partially overlap the first PCB, the second PCB, and the heatsink.

15. The ECU of claim 1 wherein:

the second and third PCBs each have a footprint, as defined by a width and length thereof in lateral and longitudinal directions, that is less than that of the first PCB, and the third PCB is arranged to at least partially overlap the first PCB, the second PCB, and the heatsink.

16. The ECU of claim 10, wherein the connector system includes first and second upper rows of connectors located at each of the first and second lateral ends of the ECU, configured to provide connections to an upper PCB located adjacent thereto.

17. The ECU of claim 1, further comprising:

a connector system including connectors or headers located at first and second lateral ends of the ECU, for providing connections to and from the PCBs,

22 wherein the connector system includes first and second upper rows of connectors located at each of the first and second lateral ends of the ECU, configured to provide connections to an upper PCB located adjacent thereto.

18. An electronic controller unit, ECU, comprising:

a heatsink including a cooling unit having a first upper and second lower cooling plate and a fluid channel arranged between the cooling plates and configured to receive a cooling fluid, wherein the cooling fluid is circulated through the channel in proximity to the cooling plates;

a first printed circuit board, PCB;

a second printed circuit board, PCB;

a plurality of components located on the first and second PCBs and facing respective first upper and second lower cooling plates of the cooling unit; and a connector system including connectors or headers located at first and second lateral ends of the ECU, wherein:

the connectors or headers are configured to provide connections to and from the PCBs, the connector system is arranged according to at least one of:

the connector system includes a first and second lower rows of connectors located at each of the first and second lateral ends of the ECU, the lower rows of connectors arranged to provide connections to the first PCB at each end of the PCB, or the connector system includes first and second upper rows of connectors located at each of the first and second lateral ends of the ECU, configured to provide connections to an upper PCB located adjacent thereto, the heatsink is arranged between the first and second PCBs, the heatsink is configured for thermally coupling to the plurality of components, and is configured to provide a thermal coupling of the plurality of components facing toward a respective cooling plate to effect cooling of the plurality of components, the first PCB is connected to the second PCB by a board-to-board connector that is configured to electrically and/or communicatively connect the PCBs located above and below the heatsink, the upper and lower cooling plates each include a plurality of thermally conducting pedestals extending outwardly therefrom towards the PCBs and the plurality of components, each pedestal is configured to provide a thermal coupling of at least one of the plurality of components to a respective cooling plate, for cooling, and the heatsink provides a core and central component of the ECU and the ECU is arranged to provide a split-level or stacked PCB arrangement, while the heatsink provides cooling to the PCBs located on both sides thereof, allowing for an efficient use of the heatsink in a compact footprint.

* * * * *